(12) United States Patent
Kodaira

(10) Patent No.: US 9,691,674 B2
(45) Date of Patent: Jun. 27, 2017

(54) SEMICONDUCTOR DEVICE AND METHOD FOR MANUFACTURING SAME

(71) Applicant: FUJI ELECTRIC CO., LTD., Kawasaki-shi, Kanagawa (JP)

(72) Inventor: Yoshihiro Kodaira, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/917,453

(22) PCT Filed: Feb. 9, 2015

(86) PCT No.: PCT/JP2015/053474
§ 371 (c)(1),
(2) Date: Mar. 8, 2016

(87) PCT Pub. No.: WO2015/141325
PCT Pub. Date: Sep. 24, 2015

(65) Prior Publication Data
US 2016/0225685 A1    Aug. 4, 2016

(30) Foreign Application Priority Data

Mar. 19, 2014    (JP) .................................. 2014-055739

(51) Int. Cl.
*H01L 23/04* (2006.01)
*H01L 23/055* (2006.01)
(Continued)

(52) U.S. Cl.
CPC ........ *H01L 23/055* (2013.01); *H01L 21/4817* (2013.01); *H01L 21/52* (2013.01);
(Continued)

(58) Field of Classification Search
CPC . H01L 23/055; H01L 23/49838; H01L 23/18; H01L 23/053; H01L 23/48; H01L 21/48; H01L 21/52
See application file for complete search history.

(56) References Cited

U.S. PATENT DOCUMENTS

| 5,365,403 A | 11/1994 | Vinciarelli et al. |
| 2001/0038143 A1* | 11/2001 | Sonobe ................... H01L 24/49 |
| | | 257/690 |

(Continued)

FOREIGN PATENT DOCUMENTS

| JP | 05-6852 U | 1/1993 |
| JP | 05-15445 U | 2/1993 |

(Continued)

OTHER PUBLICATIONS

International Search Report issued in PCT/JP2015/053474 dated Apr. 14, 2015.

(Continued)

*Primary Examiner* — Reema Patel
*Assistant Examiner* — Syed Gheyas
(74) *Attorney, Agent, or Firm* — Birch, Stewart, Kolasch & Birch, LLP

(57) ABSTRACT

Provided are a semiconductor device including a terminal, a circuit substrate, and a case body and a method for manufacturing the semiconductor device. A semiconductor device (100) includes a terminal (13), a circuit substrate (42), a case body (1), and a positioning component (21). The terminal (13) includes a first end portion (13*a*), a trunk portion (13*b*), and a second end portion (13*c*). The first end portion (13*a*) of the terminal (13) is secured to the circuit substrate (42). The case body (1) includes a main surface (1*s*), an opening portion (1*op*) on a side opposing the main surface (1*s*), and a groove hole (2) on the main surface (1*s*) side. A sidewall (5) and a through hole (4) are formed in the groove hole (2).

(Continued)

The terminal (13) passes through the through hole (4) toward the main surface (1s) side from the opening portion (1op) side of the case body (1), and the second end portion (13c) protrudes from the main surface (1s) of the case body (1). The positioning component (21) with an inclined protrusion portion (23a) formed thereon is secured in the groove hole (2). The trunk portion (13b) of the terminal (13) is pressed by the inclined protrusion portion (23a) of the positioning component (21) in a direction of the sidewall (5) of the groove hole (2) to be sandwiched between the inclined protrusion portion (23a) and the sidewall (5) and supported in the groove hole (2).

13 Claims, 15 Drawing Sheets

(51) Int. Cl.
| | |
|---|---|
| *H01L 25/07* | (2006.01) |
| *H01L 25/18* | (2006.01) |
| *H01L 23/053* | (2006.01) |
| *H01L 21/48* | (2006.01) |
| *H01L 21/52* | (2006.01) |
| *H01L 23/18* | (2006.01) |
| *H01L 23/498* | (2006.01) |

(52) U.S. Cl.
CPC ............ *H01L 23/053* (2013.01); *H01L 23/18* (2013.01); *H01L 23/49838* (2013.01); *H01L 25/07* (2013.01); *H01L 25/18* (2013.01); *H01L 2924/0002* (2013.01)

(56) References Cited

U.S. PATENT DOCUMENTS

| | | | |
|---|---|---|---|
| 2003/0015778 A1* | 1/2003 | Soyano | H01L 23/045 257/678 |
| 2010/0084760 A1* | 4/2010 | Onishi | H01L 25/072 257/691 |
| 2013/0250535 A1 | 9/2013 | Takamiya et al. | |
| 2014/0001619 A1* | 1/2014 | Yoo | H01L 24/96 257/676 |
| 2014/0168922 A1 | 6/2014 | Kodaira | |

FOREIGN PATENT DOCUMENTS

| | | | |
|---|---|---|---|
| JP | 06-509686 A | 10/1994 | |
| JP | WO 2013047101 A1 * | 4/2013 | ........ H01L 23/49811 |
| WO | WO 2012/066833 A1 | 5/2012 | |
| WO | WO 2013/027826 A1 | 2/2013 | |

OTHER PUBLICATIONS

Written Opinion of the International Searching Authority issued in PCT/JP2015/053474 dated Apr. 14, 2015.

* cited by examiner

500

23a

23a1

23a2

23a3

23a4

23a5

SEMICONDUCTOR DEVICE AND METHOD FOR MANUFACTURING SAME

TECHNICAL FIELD

The present invention relates to a semiconductor device such as a power semiconductor module for use in electric power conversion or the like and a method for manufacturing the same.

BACKGROUND ART

In recent years, integration density has become higher and higher in mounting of power semiconductor modules. Mounting external lead-out terminals of a package on a circuit substrate requires reliability of bonding strengths between the external lead-out terminals such as main terminals and control terminals and the circuit substrate and of bonded portions, and additionally requires positional accuracy relating to locations of the external lead-out terminals.

FIG. 11 is a structural view of a main part of a conventional power semiconductor module 500. A main terminal 53 and a control terminal 54 that are independent terminals are bonded to a circuit substrate 52 securely bonded on a heat-dissipating base 51, by soldering or welding. The circuit substrate 52 is covered with a resin case 55. In the resin case 55, there are formed opening portions 56 and 57, through which tip portions of the main terminal 53 and the control terminal 54 are exposed outwardly from the resin case 55. In addition, the independent terminals are terminals that are not insert-molded in the resin case 55.

In the power semiconductor module shown in FIG. 11, when a compressive load is applied to the control terminal 54, disadvantages occur where the control terminal 54 sinks into the resin case 55 or the circuit substrate 52 is cracked in a case in which the control terminal 54 is welded to the circuit substrate 52 or the control terminal 54 is less deformed. Additionally, application of a tensile load causes a disadvantage where the control terminal 54 is pulled out from the resin base 55.

One technique for solving these troubles is disclosed in Patent Document 1.

FIG. 12 are structural views of a main part of a conventional semiconductor device 600 described in Patent Document 1, in which FIG. 12(a) is a top view; FIG. 12(b) is a side view taken along line XIIb-XIIb of FIG. 12(a); FIG. 12(c) is a front view of a main terminal when seen from an arrow A direction of FIG. 12(a); and FIG. 12(d) is a detailed view of a section B of FIG. 12(b). The semiconductor device is a power semiconductor module such as an IGBT module.

The semiconductor device 600 includes a resin case 60, a heat-dissipating base 61, a circuit substrate 62, a nut glove 65, a main terminal 63, a control terminal 13f, and a resin block 71. The circuit substrate 62 is securely bonded on the heat-dissipating base 61. The main terminal 63 and the control terminal 13f that are independent terminals for external leading-out (external connection) are soldered or welded onto the circuit substrate 62.

The main terminal 63 and the control terminal 13f are exposed outside the resin case 60 from an opening portion 64 and an opening portion 2a, respectively, on a top surface side of the resin case 60. Additionally, the main terminal 63 is secured to the resin case 60 by the nut glove 65, and the control terminal 13f is secured to the resin case 60 by the resin block 71. The nut glove 65 is inserted between two legs 66 of the main terminal 63 so as to pass through an inside of a U-shaped hole of the main terminal 63 exposed from the opening portion 64 on the top surface side of the resin case 60, thereby securing the main terminal 63.

The control terminal 13f includes an upright portion that is substantially upright with respect to the circuit substrate 62 and whose one end is exposed outside the resin case 60 and a connecting portion connected to the other end of the upright portion so as to form a substantially L-shape together with the upright portion. A side end face of the upright portion (hereinafter referred to simply as side end face) of the control terminal 13f is provided with first and second protrusions 16a and 17a and a concave valley 18a formed by the first protrusion portion 16a and the second protrusion portion 17a.

FIG. 13 are views of the resin block 71 that secures the control terminal 13f, in which FIG. 13(a) is a plan view; FIG. 13(b) is a bottom view; and FIG. 13(c) is a side view. A third protrusion portion 73 is formed on both side faces 72 of the resin block 71, and a fourth protrusion portion 75 is formed on a bottom surface 74 thereof. Additionally, a convex stepped portion 76 is formed on both side faces 72, and a concave groove 79 is formed at a front-side end portion 78 of the resin block 71. Front-side end portions 77 of the convex stepped portions 76 are fitted into the valley 18a between the first protrusion portion 16a and the second protrusion portion 17a of the control terminal 13f.

RELATED ART DOCUMENT

Patent Document

PATENT DOCUMENT 1: WO 2013/27826

SUMMARY OF THE INVENTION

Problems to be Solved by the Invention

However, in the semiconductor device 600, even when the control terminal 13f is secured using the resin block 71, positional accuracy of the control terminal 13f with respect to the semiconductor device 600 depends on variation in dimensions of respective constituent components and assembly accuracy of the entire semiconductor device 600. Thus, further improvement in positional accuracy has been desired.

It is an object of the present invention to provide a semiconductor device and a method for manufacturing the same that can solve the above-described problem to allow highly accurate positioning of a terminal and a tip portion thereof.

Means for Solving the Problems

In order to solve the problem, a semiconductor device of a first aspect of the present invention has the following characteristics.

The semiconductor device includes a terminal, a circuit substrate, a case body, and a positioning component. The terminal includes a first end portion, a trunk portion, and a second end portion in this order. The first end portion of the terminal is secured to the circuit substrate. The case body includes a main surface and an opening portion that houses the circuit substrate and is on a side opposing the main surface. The case body further includes a groove hole (slot) on the main surface side. The groove hole includes a first corner portion, a sidewall, and a second corner portion that are located toward the opening portion from the main surface, and in which a through hole located adjacent to the second corner portion is formed. The first corner portion is located on a main surface side of the groove hole, and the second corner portion is located on an opening portion side thereof, respectively. The positioning component (locating part) includes a first side face, a second side face opposing the first side face, a front end face positioned between the first side face and the second side face, and a back end face opposing the front end face. In the positioning component, furthermore, an inclined protrusion portion that becomes thicker toward the back end face from the front end face is formed on the first side face.

The positioning component is secured in the groove hole. The terminal passes through the through hole toward the main surface side from the opening portion side. The trunk portion of the terminal is pressed by the inclined protrusion portion in a sidewall direction to be sandwiched between the inclined protrusion portion and the sidewall, and also the trunk portion is supported by the first corner portion or the second corner portion. The second end portion of the terminal protrudes from the main surface of the case body.

In this manner, while being supported by the first corner portion of the groove hole on the main surface side or the second corner portion of the groove hole on the opening portion side, the trunk portion of the terminal is pressed and bent by the inclined protrusion portion of the positioning component in the sidewall direction of the groove hole to be sandwiched between the inclined protrusion portion and the sidewall, so that the second end portion of the terminal is located with high accuracy with respect to the case body.

Additionally, in order to solve the above problem, a method for manufacturing a semiconductor device of a second aspect of the present invention has the following characteristics.

In the second aspect, a circuit substrate, a case body, and a positioning component are prepared, and a semiconductor device is manufactured by steps including a first step and a second step.

A terminal including a first end potion, a trunk portion, and a second end portion in this order is secured to the circuit substrate. The first end portion of the terminal is secured to the circuit substrate. The case body includes a main surface and an opening portion on a side opposing the main surface, and also includes a groove hole on the main surface side. The groove hole includes a first corner portion, a sidewall, and a second corner portion that are located toward the opening portion from the main surface. In the groove hole, furthermore, there is formed a through hole located adjacent to the second corner portion. The first corner portion is located on a main surface side of the groove hole, and the second corner portion is located on an opening portion side thereof, respectively. The positioning component includes a first side face, a second side face opposing the first side face, a front end face positioned between the first side face and the second side face, and a back end face opposing the front end face. In the positioning component, furthermore, an inclined protrusion portion that becomes thicker toward the back end face from the front end face is formed on the first side face.

At the first step, the circuit substrate is housed in the opening portion so that the second end portion of the terminal passes through the through hole toward the main surface side from the opening portion side of the case body. At the second step, the positioning component is inserted into the groove hole, and secured in the groove hole so that, while bending by being pressed by the inclined protrusion portion in the sidewall direction, the trunk portion of the terminal is sandwiched between the inclined protrusion portion and the sidewall and supported by the first corner portion or the second corner portion.

In this manner, while being supported by the first corner portion or the second corner portion of the groove hole, the trunk portion of the terminal is bent by being pressed by the inclined protrusion portion in the sidewall direction of the groove hole and is sandwiched between the inclined protrusion portion and the sidewall, so that the second end portion of the terminal is located with high accuracy with respect to the case body.

Effects of the Invention

According to the present invention, there can be provided a semiconductor device in which a terminal is positioned with high accuracy. Additionally, there can be provided a method for manufacturing a semiconductor device, which allows highly accurate positioning of a terminal.

MODE FOR CARRYING OUT THE INVENTION

Hereinafter, embodiments of a semiconductor device and a method for manufacturing the semiconductor device according to the present invention will be described with reference to the accompanying drawings.

First Embodiment

Figure 1:
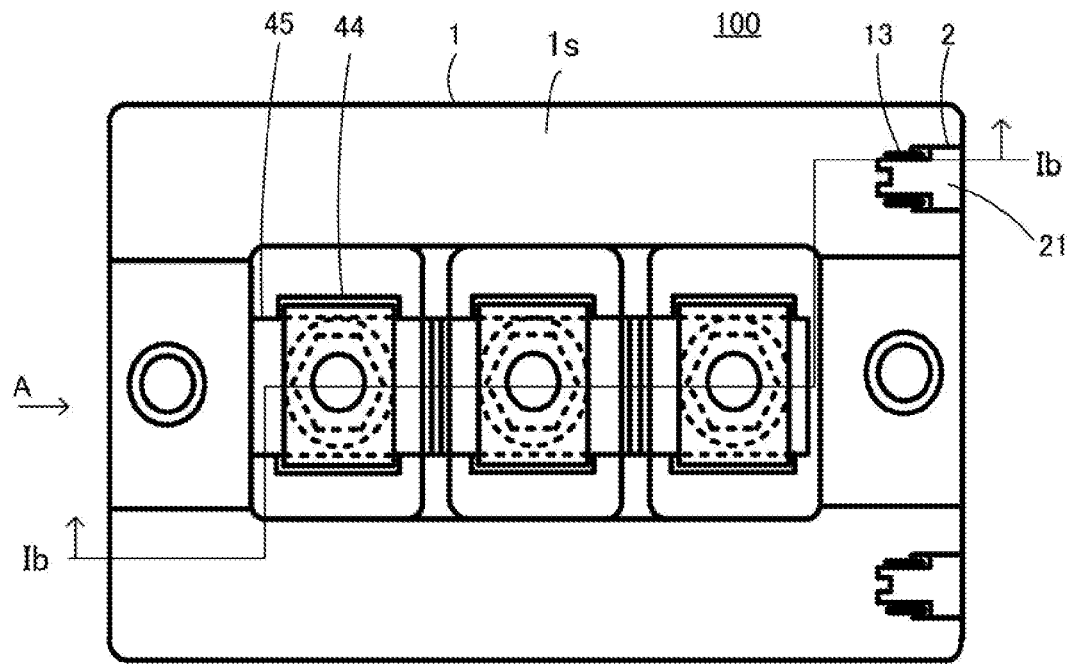
FIG. 1 are illustrative views showing a structure of a main part of a semiconductor device according to a first embodiment of the present invention.
Figure 1:
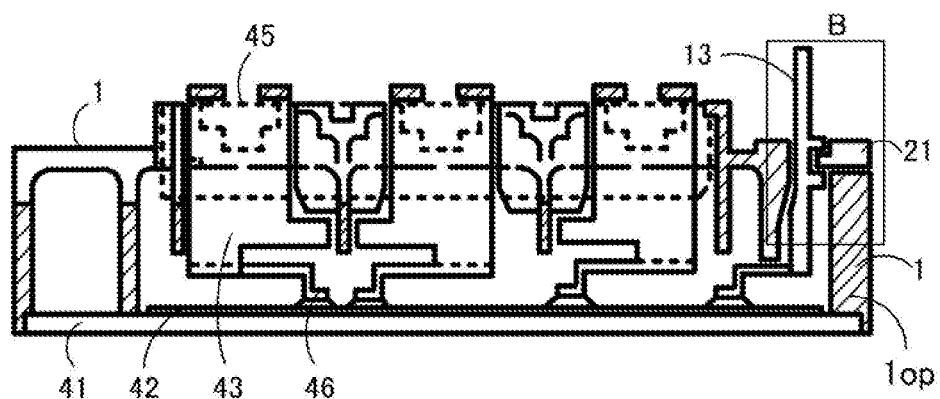
Figure 1:
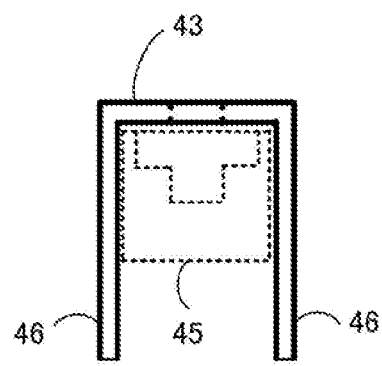
Figure 1:
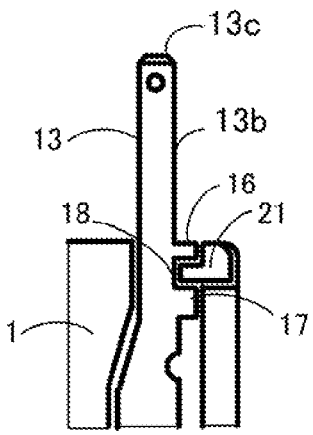

FIG. 1 are illustrative views showing a structure of a main part of a semiconductor device according to a first embodiment. FIG. 1(a) is a plan view when a semiconductor device 100 according to the first embodiment is seen from a main surface 1s side. FIG. 1(b) is a side view taken along line 1b-1b of FIG. 1(a). FIG. 1(c) is a front view of a main terminal 43 when seen from an arrow A direction of FIG. 1(a). FIG. 1(d) is a sectional view showing in detail a section B surrounded by a rectangular frame in FIG. 1(b). The semiconductor device 100 is a power semiconductor module such as, for example, an IGBT module.

As shown in FIG. 1, the semiconductor device 100 includes a control terminal 13, a circuit substrate 42, a resin case 1 as a case body, and a resin block 21 as a positioning component. The semiconductor device 100 can further include a heat-dissipating base 41, a nut case 45, and a main terminal 43.

The resin case 1 is of a box shape provided with a main surface 1s and an opening portion 1op on a side opposing the main surface 1s. In the illustrated example, the circuit substrate 42 is securely bonded onto the heat-dissipating base 41. The opening portion 1op of the resin case 1 is bonded to a peripheral edge of the heat-dissipating base 41 and houses the circuit substrate 42. The main terminal 43 for external leading-out (external connection) and the control terminal 13 are bonded onto the circuit substrate 42. The method for the bonding is, for example, soldering, brazing, ultrasonic bonding, or welding. As the main terminal 43 and the control terminal 13, examples of independent terminals not insert-molded in the resin case 1 are shown.

In the illustrated example, the main terminal 43 is exposed outside the resin case 1 from a top surface of the resin case 1, i.e., an opening portion 44 of the main surface 1s side. Additionally, the main terminal 43 is secured by the nut case 45, as illustrated, but may be secured by other means.

As one example, the main terminal 43 has an inverted U shape, and a top part of the main terminal 43, i.e., a bottom part of the letter U is exposed to an outside of the resin case 1 from the opening portion 44 of the top surface side of the resin case 1. Two legs 46 (opening end portions of the letter U) of the main terminal 43 are soldered or welded to the circuit substrate 42. The nut case 45 is a resin body housing a nut for connecting an external wire to the main terminal 43 and is inserted between the two legs 46 of the main terminal 43 so as to pass through an inside of a U-shaped hole of the main terminal 43 exposed from the opening portion 44 on the top surface side of the resin case 1, thereby securing the main terminal 43.

The control terminal 13 protrudes from an opening portion 2 as a groove hole (slot) for the control terminal of the top surface (main surface 1s) side of the resin case 1 to the outside of the resin case 1. Additionally, the control terminal 13 is secured to the resin case 1 by the resin block 21. The control terminal 13 is a gate terminal, a sense terminal, or the like.

Next, a further description will be given of structures of the opening portion 2 of the resin case 1, the control terminal 13, and the resin block 21.

Figure 2:
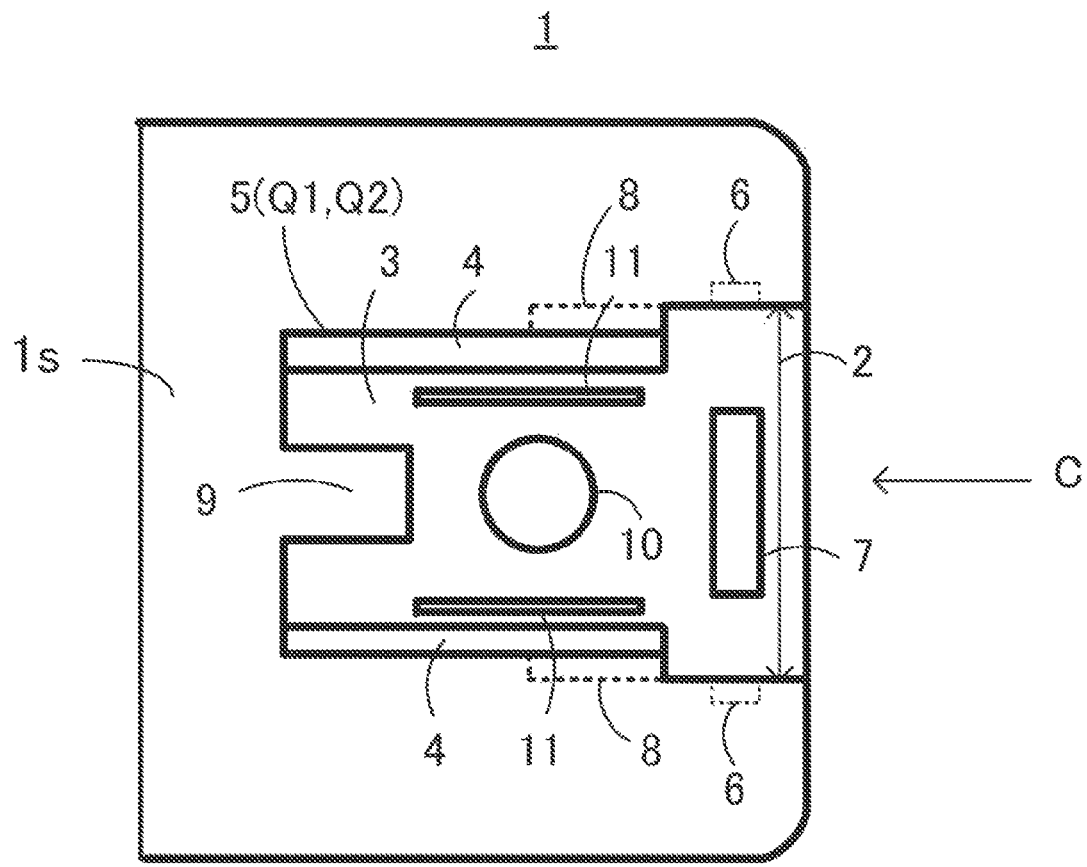
FIG. 2 are illustrative views showing a structure of a main part of a vicinity of an opening portion for a control terminal of FIG. 1.
Figure 2:
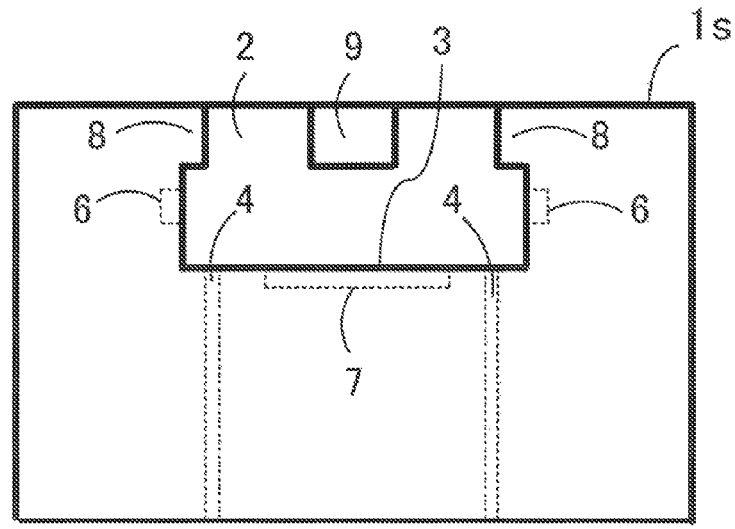

FIG. 2 are illustrative views showing the structure of the opening portion 2 of the resin case 1 of FIG. 1. FIG. 2(a) is a partial plan view of the opening portion 2 of the resin case 1 and a portion of a vicinity thereof. FIG. 2(b) is a back view of the resin case 1 when FIG. 2(a) is seen from an arrow C direction. The resin case 1 includes the top surface (main surface 1s) and side faces adjacent to the main surface. In the resin case 1, the opening portion 2 is formed as a groove hole that straddles over the top surface (main surface 1s) and the side faces of the resin case 1.

The opening portion 2 includes a first corner portion Q1, an opening portion sidewall 5, and a second corner portion Q2 that are located toward the opening portion 1op from the main surface 1s side. The first corner portion Q1 and the second corner portion Q2 can be understood by FIG. 6. A through hole 4 is located adjacent on the opening portion 1op side of the second corner portion Q2.

The opening portion 2 can further include the following structure. In the illustrated example, a beam portion 3 is formed on a bottom surface side of the opening portion 2. A convex first hood portion (first stepped portion) 8 protruding toward an inside of the opening portion 2 from the sidewall 5 is formed on main surface 1s sides of both sides of the opening portion sidewall 5 of the opening portion 2. Furthermore, a convex second hood portion (second stepped portion) 9 protruding toward the inside of the opening portion 2 is formed on a front-side sidewall on the front side of the opening portion 2. The front-side sidewall of the opening portion 2 is a sidewall opposing an inlet of the opening portion 2 on a side face side of the resin case 1. Additionally, on the opening portion sidewall 5, a first concave portion 6 is formed toward an outside of the opening portion 2. The first concave portion 6 is located at a position spaced apart from the first hood portion 8. In the beam portion 3, a second concave portion 7 is formed toward the opening portion 2 side. In addition, the through hole 4 is formed between the beam portion 3 and the opening portion sidewall 5. Additionally, in the beam portion 3, there are formed a third concave portion 10 in which a non-illustrated adhesive agent is dropped (or applied) and a liquid reservoir portion 11 that prevents the adhesive agent from flowing out to the control terminal 13 side.

Figure 3:
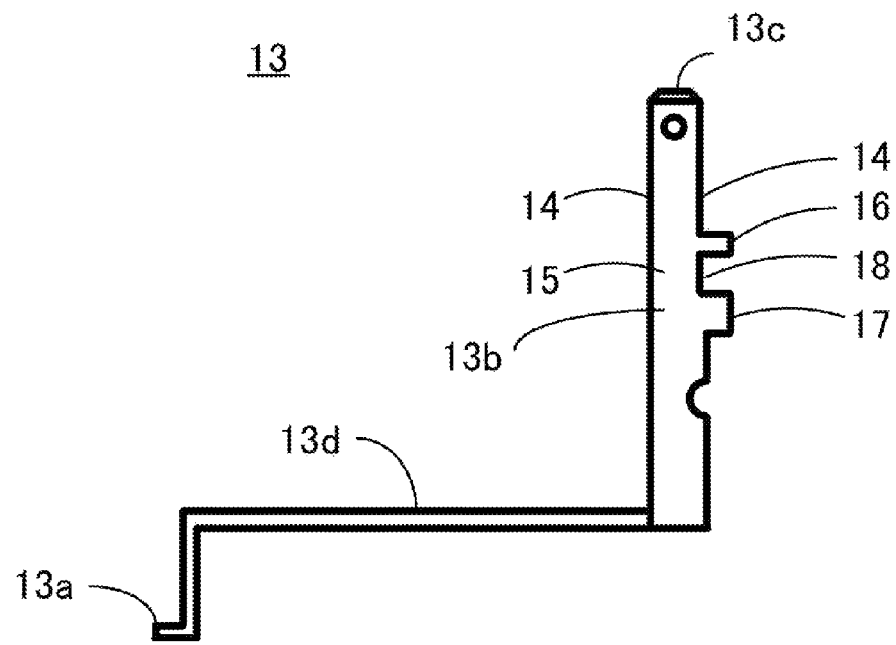
FIG. 3 are illustrative views showing a structure of the control terminal of FIG. 1.
Figure 3:
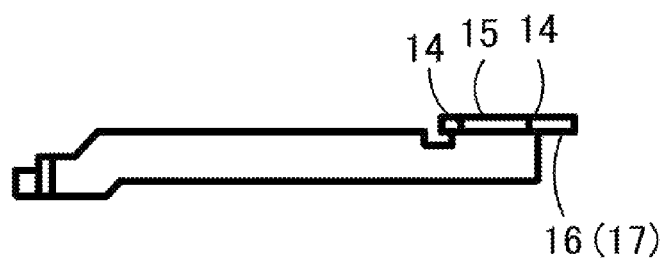

The control terminal 13 will be described with reference to FIG. 1(d) and FIG. 3. FIG. 1(d) is a sectional view showing in detail a periphery of the control terminal 13 of FIG. 1(b). FIG. 3 are illustrative view showing a structure of the control terminal 13. FIG. 3(a) is a side view of the control terminal 13, and FIG. 3(b) is a top view of the control terminal 13.

The control terminal 13 includes a first end portion 13a, a trunk portion 13b, and a second end portion 13c in this order. The control terminal 13 may include a connecting portion 13d between the first end portion 13a and the trunk portion 13b. In the control terminal 13, the first end portion 13a is secured to the circuit substrate 42.

In the illustrated example, the control terminal 13, whose trunk portion 13b is substantially upright with respect to the circuit substrate 42, includes the second end portion 13c exposed outside the resin case 1 and the connecting portion 13d connected to the other end of the trunk portion 13b so as to form a substantially L shape together with the trunk portion 13b. The first end portion 13a is formed at an opposite side of the connecting portion 13d with respect to the trunk portion 13b. The first end portion 13a is secured to the circuit substrate 42 by soldering, welding, or the like. The control terminal 13 is made of, for example, a plate material or a wire material of copper, copper alloy, aluminum, aluminum alloy, or the like.

On one of side faces the trunk portion 13b of the control terminal 13 (hereinafter referred to simply as side end faces) 14, there may be provided a first protrusion portion 16, a second protrusion portion 17 spaced apart from the first protrusion portion 16, and a concave valley (concave portion) 18 between the first protrusion portion 16 and the second protrusion portion 17. Symbol 15 in FIG. 3 denotes a flat surface of the trunk 13b (hereinafter referred to simply as flat plate surface).

Figure 4:
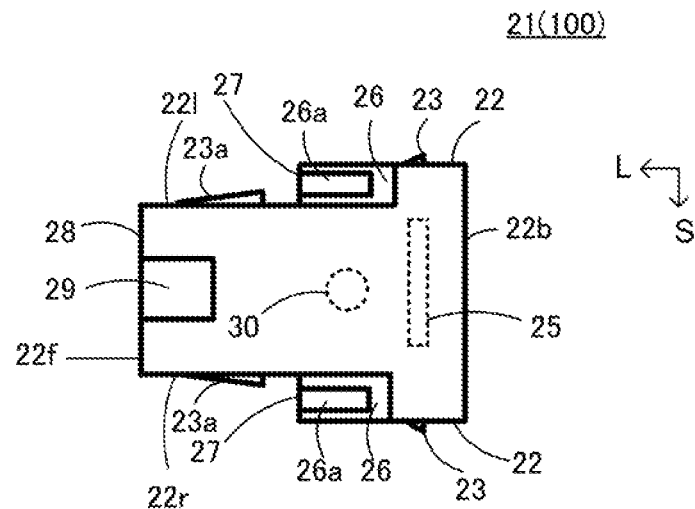
FIG. 4 are illustrative views showing a structure of a resin block of FIG. 1.
Figure 4:
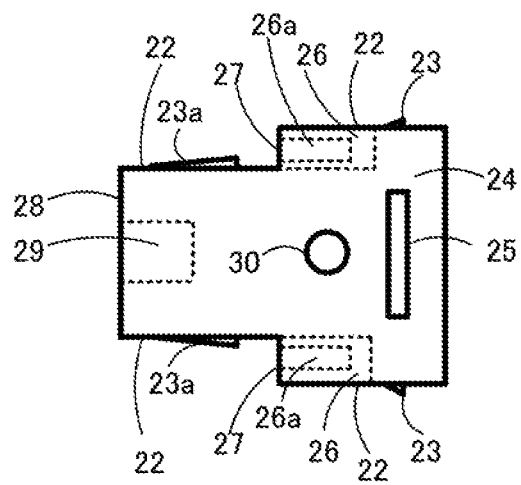
Figure 4:
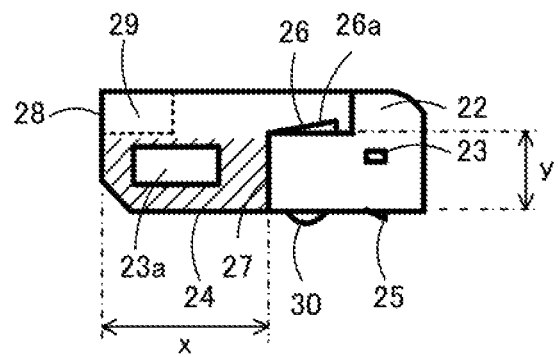

FIG. 4 are illustrative views showing a structure of the resin block 21 that positions and secures the control terminal 13. FIG. 4(a) is a plan view of the resin block 21. In the drawing, arrows, respectively, indicate a longer direction (L) and a shorter direction (S) of the resin block 21. FIG. 4(b) is a bottom view of the resin block 21. FIG. 4(c) is a side view of the resin block 21.

The resin block 21 includes, as side faces, a first side face 22r, a second side face 22l opposing the first side face 22r, a front end face 22f positioned between the first side face 22r and the second side face 22l, and a back end face 22b opposing the front end face 22f. An inclined protrusion portion 23a that becomes thicker toward the back end face 22b side from the front end face 22f side is formed on at least any one of the first side face 22r and the second side face 22l.

In the resin block 21, as illustrated, a convex stepped portion 26 may be formed on the side face sides, and a fourth protrusion portion 25 may be formed on a bottom surface 24 side. A sixth protrusion portion 26a is formed on a top surface of the convex stepped portion 26. On the sixth protrusion portion 26a, a taper is formed so that a height thereof becomes higher toward a rear side from a front side of the resin block 21. The rear side of the resin block 21 is a side positioned at the inlet of the opening portion 2 of the side face side of the resin case 1 after assembly of the semiconductor device 100.

Forming the taper on the sixth protrusion portions 26a allows the resin block 21 to be smoothly inserted into the opening portion 2 of the resin case 1.

In the illustrated example, the convex stepped portions 26 are formed on lower sides of the first side face 22r and the second side face 22l at rear end portions of the resin block 21. A concave groove 29 is formed at a front end portion 28 of the resin block 21. The front end portion 28 is an end portion opposing the front-side sidewall of the opening portion 2 of the resin case 1 after assembly of the semiconductor device 100. In addition, the resin block 21 has a shape of a letter T, L, or the like in a plan view and is produced by resin molding or the like.

Figure 5:
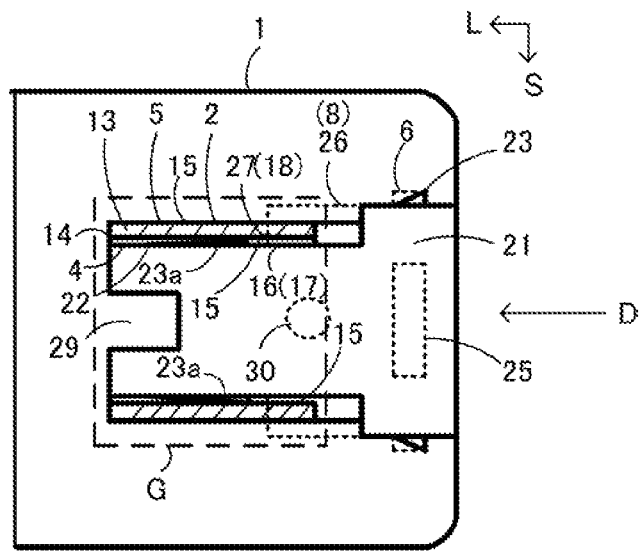
FIG. 5 are illustrative views showing a state in which the control terminal and the resin block are provided in an inserted manner (inserted and installed) in the opening portion for the control terminal of FIG. 2.
Figure 5:
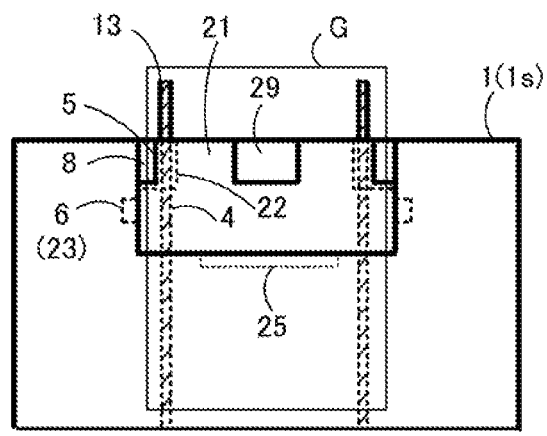
Figure 5:
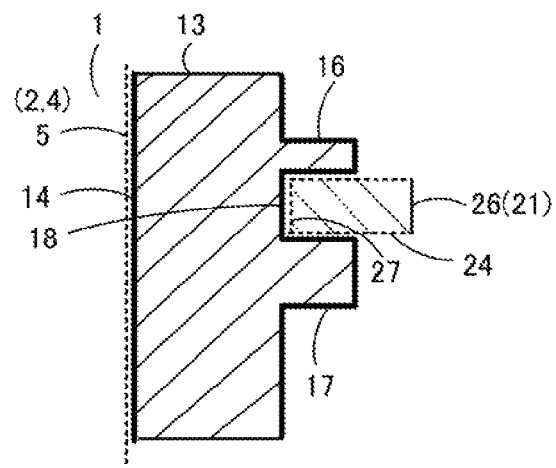

FIG. 5 show a state in which the resin block 21 is inserted and secured in the opening portion 2 of the resin case 1 of FIG. 2. FIG. 5(a) is a plan view showing locations of the opening portion 2, the control terminal 13, and the resin block 21. FIG. 5(b) is a back view when seen from an arrow D direction (rear side) of FIG. 5(a). FIG. 5(c) is a sectional view showing a state in which a front end portion 27 of the convex stepped portion 26 of the resin block 21 is fitted in the valley 18 of the control terminal 13. In addition, FIG. 6 is an enlarged view of a section G of FIG. 5(b), which is a view illustrating a state of positioning of the control terminal 13.

The resin block 21 is inserted into the opening portion 2 and secured in the opening portion 2 by fitting or adhesion. The control terminal 13 passes through the through hole 4 toward the main surface 1s side from the opening portion 1 op of the resin case 1. A part of the trunk portion 13b of the control terminal 13 is sandwiched between the inclined protrusion portion 23a and the opening portion sidewall 5 while bending by being pressed by the inclined protrusion portion 23a in the direction of the opening portion sidewall 5, and an other part of the trunk portion 13b is supported by a first corner portion or the second corner portion of the opening portion sidewall 5. The second end portion 13c protrudes from the main surface is of the resin case 1.

Figure 6:
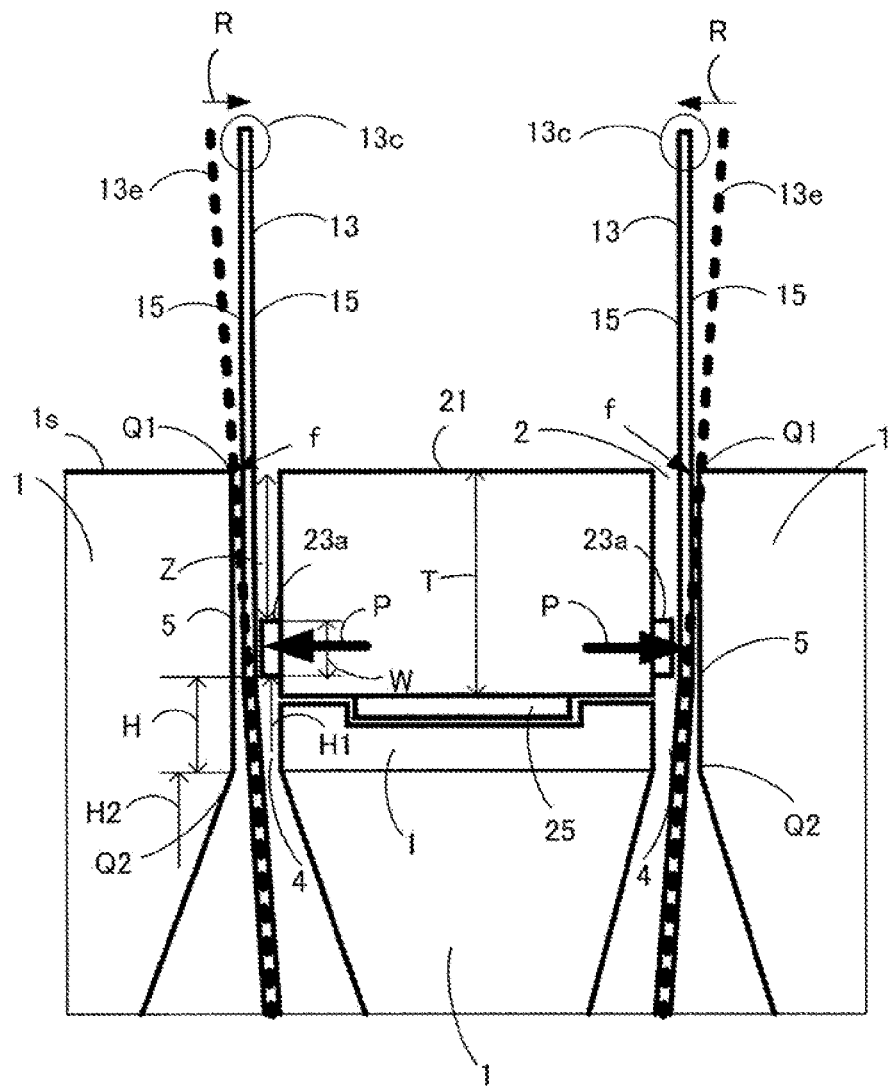
FIG. 6 is an enlarged view of a section G of FIG. 5(b), which is a view illustrating a situation of positioning of a control terminal 13 by a resin block 21.

As shown in FIG. 6, when the resin block 21 is inserted into the opening portion 2, the inclined protrusion portion 23a serves as a wedge, whereby a flat plate surface 15 of the trunk portion 13b is pressed at a load P in a direction substantially perpendicular to an insertion direction. The trunk portion 13b of the control terminal 13 is sandwiched between the opening portion sidewall 5 and the inclined protrusion portion 23a. The position of a direction orthogonal to the arrow D direction of the control terminal 13 (a direction orthogonal to the flat plate surface 15 of the control terminal 13 or the shorter direction S) is secured. In the illustrated example, before inserting the resin block 21, the control terminal 13 is inclined as indicating a position before movement by a dotted line 13e and is in contact with the first corner portion Q1 on the upper end side of the opening portion sidewall 5. Along with entry of the resin block 21, when the load P is applied to the trunk portion 13b from the inclined protrusion portion 23a, the trunk portion 13b is bent and closely contacts with the opening portion sidewall 5, and the second end portion 13c rotates about the first corner portion Q1 as a fulcrum in an arrow R direction, so that the control terminal 13 can be positioned with high accuracy with respect to the resin case 1. In other words, by inserting and installing the resin block 21 in the opening portion 2 of the resin case 1, the advancement of the tapered inclined protrusion portion 23a allows an inclined control terminal 13e indicated by the dotted line 13e to be press-contacted and corrected to a perpendicular position, whereby the position of the second end portion 13c of the control terminal 13 is positioned at a normal position, as indicated by a solid line in FIG. 6.

In addition, a width W of the inclined protrusion portion 23a may be in a range of 0.1 times or more and 0.5 times or less, and preferably 0.2 times or more and 0.5 times or less than a thickness T of the resin block 21. At widths less than 0.2 times, an area of the inclined protrusion portion 23a with respect to the opening portion sidewall 5 becomes small, which can cause deformation of a vertex of the inclined protrusion portion 23a. Additionally, at widths more than 0.5 times, in a case in which the control terminal 13 formed by molding has a burr, the resin block 21 is hindered by the burr and not smoothly inserted. In addition, although the vertex of the inclined protrusion portion 23a is shown by a sharp edge shape, the vertex thereof may be flattened or a curved surface. In addition, the inclined protrusion portion 23a may be formed on the first side face 22r or the second side face 22l so that when the resin block 21 is inserted into the opening portion 2, the inclined protrusion portion 23a is positioned closer to the second corner portion Q2 between the first corner portion Q1 and the second corner portion Q2 of the opening portion sidewall 5. In the example shown in FIG. 6, a distance Z between a top surface of the inclined protrusion portion 23*a* and a top surface of the resin block 21 may be set to about ⅓ to ½ of the thickness T of the resin block 21. Positioning the inclined protrusion portion 23*a* closer to the second corner portion Q2 increases a length of the close contact between the trunk portion 13*b* and the opening portion sidewall 5, thereby facilitating improvement in positional accuracy. Additionally, preferably, the inclined protrusion portion 23*a* is formed in a hatched range (x, y) of FIG. 4(*c*). The x indicates a range of from the front end face 22*f* to the front-side end portion 27 of the stepped portion 26, and the y indicates a range of from the bottom surface to an upper end of the stepped portion 26. Locating the inclined protrusion portion 23*a* in the range (x, y) allows smooth engagement of the valley 18 of the control terminal 13 and the front-side end portion 27.

More preferably, the opening portion 2 and the resin block 21 are located so that a position H1 of a bottom surface of the inclined protrusion portion 23*a* is closer to the main surface 1*s* side than to a position H2 of a lower end portion Q2 of the opening portion sidewall 5.

Figure 14:
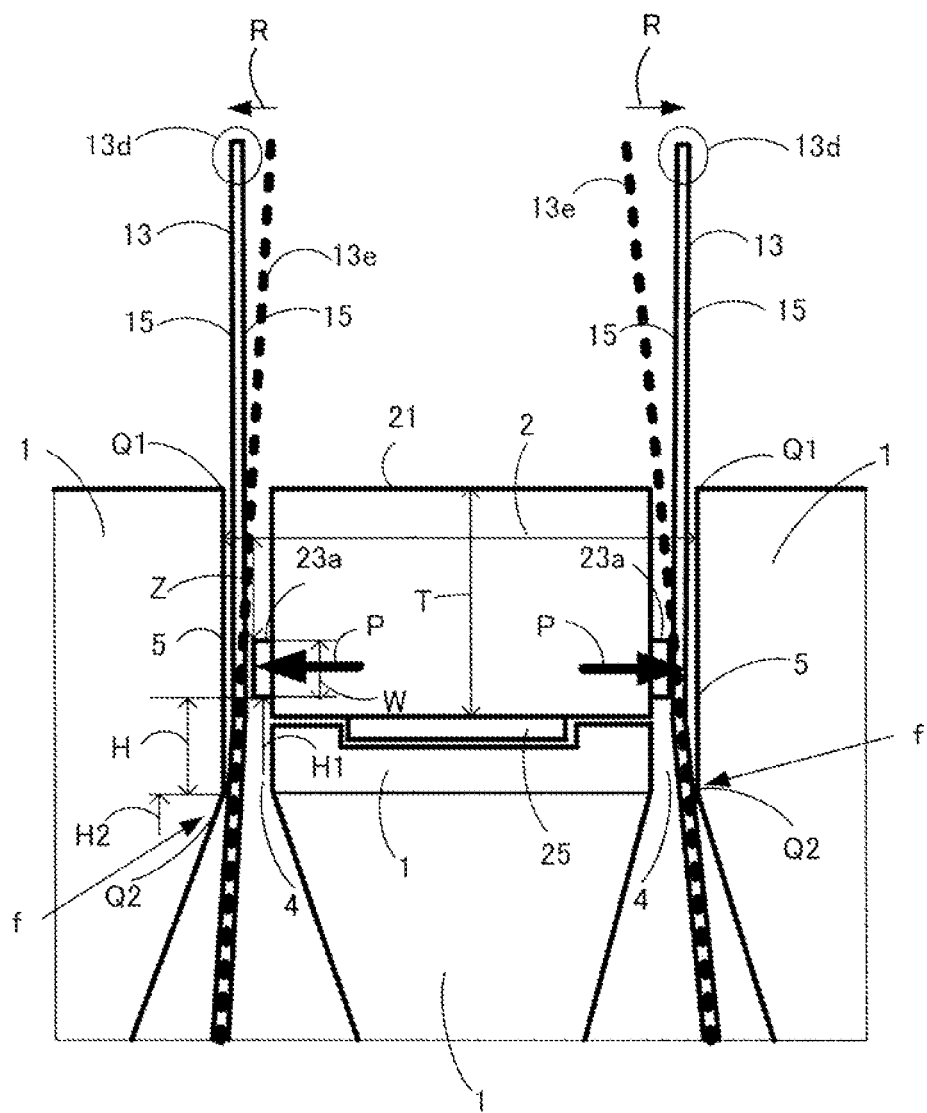
FIG. 14 is an enlarged view of the section G of FIG. 5(b) showing a modified example of the first embodiment, which is a view illustrating a situation of positioning of the control terminal 13 by the resin block 21.

FIG. 14 is an enlarged view of the section G of FIG. 5(*b*), which is a view illustrating another example of the state of positioning of the control terminal 13. FIG. 6 has shown the example in which the control terminal 13 is inclined outwardly as indicated by the dotted line 13*e*, whereas FIG. 14 shows an example in which the control terminal 13 is inclined inwardly as indicating a position before movement by the dotted line 13*e*.

In the example of FIG. 14, before inserting the resin block 21, the control terminal 13 is in contact with the second corner portion Q2 on the lower end side of the opening side wall 5. When a load P is applied to the trunk portion 13*b* from the inclined protrusion portion 23*a*, the trunk portion 13*b* is bent and closely contacts with the opening portion sidewall 5, and the second end portion 13*c* rotates about the second corner portion Q2 as a fulcrum in an arrow R direction, so that the control terminal 13 can be positioned with high accuracy with respect to the resin case 1. In this example, it is preferable to set a distance H between the H1 and the H2 to ⅕ or more of the thickness T of the resin block 21, since a rotating moment works well when the second corner portion Q2 is the fulcrum.

As described above, in the control terminal 13, preferably, the first protrusion portion 16, the second protrusion portion 17 spaced apart from the first protrusion portion 16, and the concave valley 18 between the first protrusion portion 16 and the second protrusion portion 17 are provided on the trunk portion 13*b*. Additionally, the opening portion 2 preferably includes the first concave portion 6 formed in the opening portion sidewall 5 and the beam portion 3 that is located on the bottom surface side thereof and in which the second concave portion 7 is formed. Additionally, preferably, the resin block 21 includes the convex stepped portion 26 and the third protrusion portion 23 on the side face sides thereof and includes a fifth protrusion portion 30 on the bottom surface side thereof.

As shown in FIG. 5(*c*), the front-side end portion 27 of the convex stepped portion 26 of the resin block 21 is fitted into the valley 18 of the control terminal 13. The front-side end portion 27 of the convex stepped portion 26 is an end portion opposing a side end face 14 of the control terminal 13 after assembly of the semiconductor device 100.

Fitting the front-side end portion 27 of the convex stepped portion 26 into the valley 18 allows the control terminal 13 to be supported in the arrow D direction (longer direction L).

In addition, the tapered sixth protrusion portion 26*a* may be not provided on the top surface of the stepped portion 26.

Figure 15:
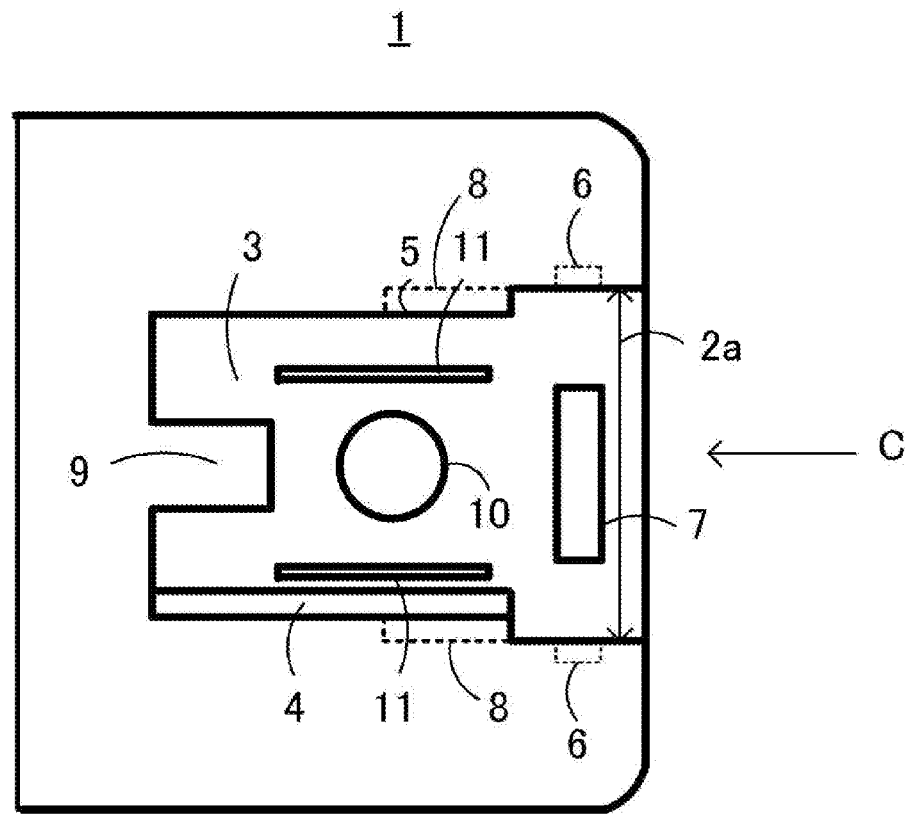
FIG. 15 are illustrative views showing a modified example of the opening portion for the control terminal and a modified example of the resin block of the first embodiment.
Figure 15:
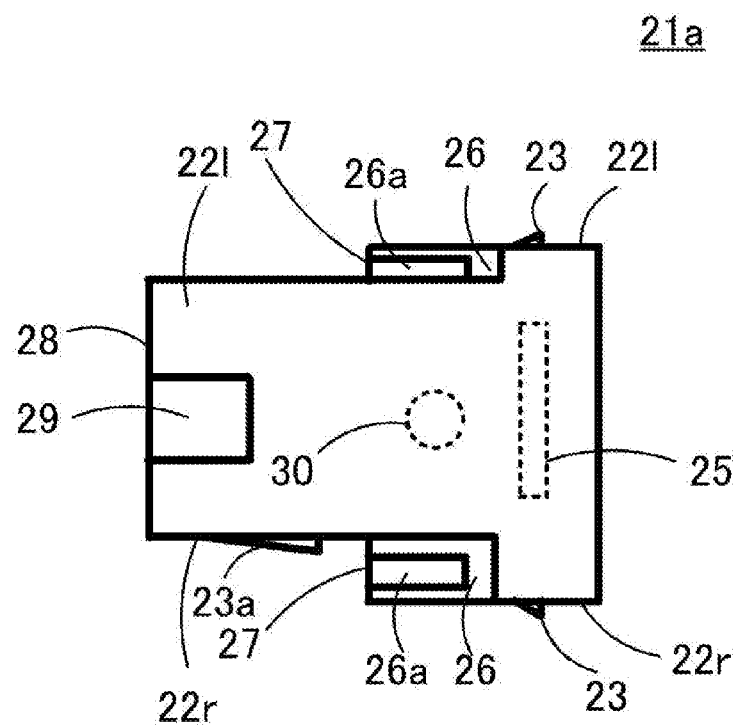

FIG. 15 show modified examples of the opening portion 2 and the resin block 21. In the above-described example, two through holes 4 have been formed in the single opening portion 2, and each one control terminal 13 has been located in each through hole 4. As shown in FIG. 15(*a*), one through hole 4 may be formed in an opening portion 2*a*, and the control terminal 13 may be located in the through hole 4 and secured by a resin block 21*a* including the inclined protrusion portion 23*a* only on the first side face 22*r*, which is shown in FIG. 15(*b*).

Figure 16:
FIG. 16 are illustrative views showing main parts of other modified examples of the resin block of the first embodiment.
Figure 16:
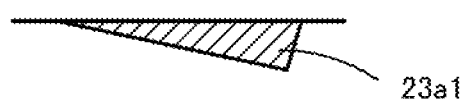
Figure 16:
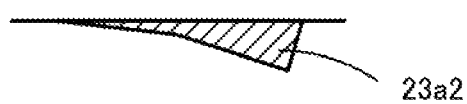
Figure 16:
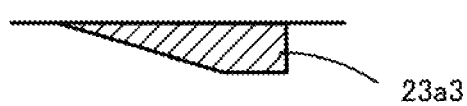
Figure 16:
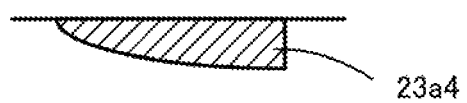
Figure 16:
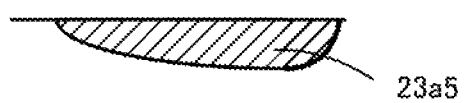
Figure 16:
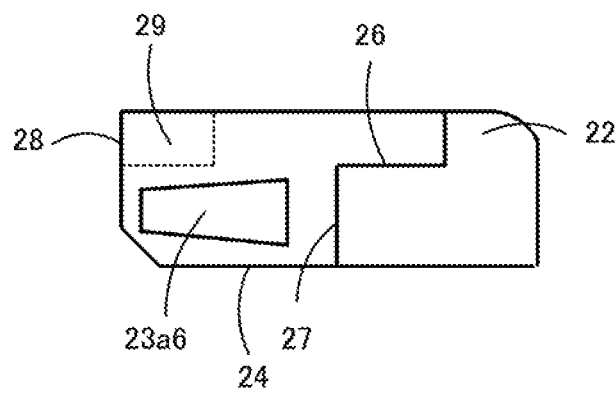
Figure 16:
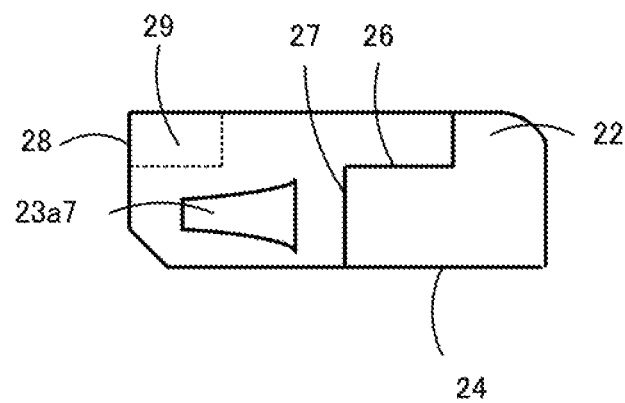

Additionally, FIG. 16 show modified examples of the inclined protrusion portion 23*a*. As the shape of the inclined protrusion portion 23*a*, various shapes can be employed that become gradually thicker toward the back end face 22*b* from the front end face 22*f* side of the resin block 21. FIGS. 16(*a*) to 16(*f*) show, as examples of such shapes, sections of inclined protrusion portions 23*a* to 23*a*5. FIGS. 16(*g*) to 16(*h*) are side face views showing modified examples 23*a*6 and 23*a*7 of the inclined protrusion portion 23*a*. Besides the inclined protrusion portions 23*a* having strip shapes as seen from a side face, the trapezoid inclined protrusion portions 23*a*6 and 23*a*7 can be employed.

Second Embodiment

FIGS. 7 to 10 are illustrative views showing steps of a method for manufacturing a semiconductor device according to a second embodiment. Steps for manufacturing the semiconductor device 100 shown in FIG. 1 are exemplified. In FIGS. 7 to 10, (a) are sectional views of an entirety of the semiconductor device 100, and (b) are top-surface enlarged views of a vicinity of the control terminal 13.

As shown in FIGS. 7 to 10, the steps for manufacturing the semiconductor device 100 include the following steps:
(Component Preparation Step)

The control terminal 13, the circuit substrate 42, the resin case 1, and the resin block 21 are prepared.

The control terminal 13 includes the first end portion 13*a*, the trunk portion 13*b*, and the second end portion 13*c* in this order. The first end portion 13*a* of the control terminal 13 is secured to the circuit substrate 42. The resin case 1 includes the main surface is and the opening portion 1*op* on the side opposing the main surface 1*s*. The resin case 1 further includes the first corner portion Q1, the opening portion sidewall 5, and the second corner portion Q2 that are located toward the opening portion 1*op* from the main surface 1*s*. The through hole 4 is formed adjacent to the second corner portion Q2. The resin block 21 includes the first side face 22*r*, the second side face 22*l* opposing the first side face 22*r*, the front end face 22*f* positioned between the first side face 22*r* and the second side face 22*l*, and the back end face 22*b* opposing the front end face 22*f*. In the resin block 21, furthermore, the inclined protrusion portion 23*a* that becomes thicker toward the back end face 22*b* from the front end face 22*f* side is formed on the first side face 22*r*.
(First Step)

The circuit substrate 42 is housed in the opening portion 1*op* so that the second end portion 13*c* of the control terminal 13 passes through the through hole 4 toward the main surface 1*s* side from the opening portion 1*op* side of the resin case 1.
(Second Step)

The resin block 21 is inserted and secured in the opening portion 2. At this time, while bending by being pressed by the inclined protrusion portion 23*a* in a direction of the opening portion sidewall 5, the trunk portion 13b of the control terminal 13 is sandwiched between the inclined protrusion portion 23a and the opening portion sidewall 5 and supported by the first corner portion Q1 or the second corner portion Q2.

Figure 7:
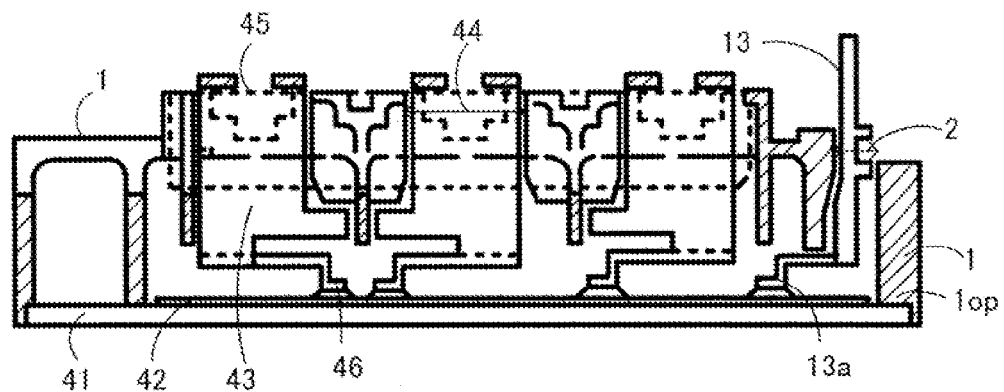
FIG. 7 are illustrative views showing steps for manufacturing a semiconductor device according to a second embodiment of the invention.
Figure 7:
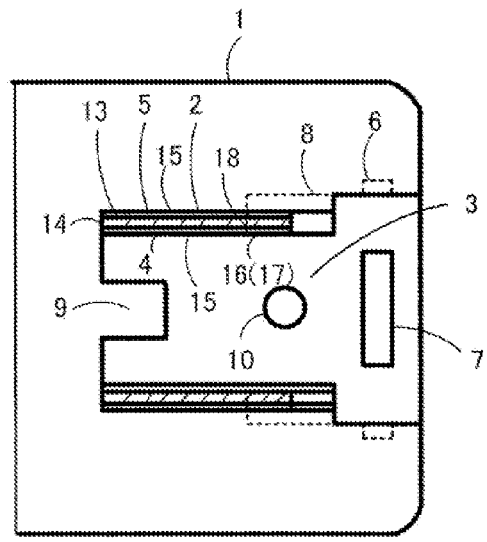

The example of the manufacturing method will be further described. As shown in FIG. 7, the circuit substrate 42, a non-illustrated semiconductor chip, the main terminal 43, and the control terminal 13 are securely bonded to the heat-dissipating base 41 by soldering, welding, or the like. The two legs 46 of the main terminal 43 and the first end portion 13a of the control terminal 13, respectively, are secured to the circuit substrate 42.

Next, the opening portion 1op of the resin case 1 is bonded to a peripheral edge of the heat-dissipating base 41 so as to house the circuit substrate 42. At this time, the main terminal 43 is exposed from an upper side of an opening portion 44 of the resin case 1, and the control terminal 13 is caused to pass through the through hole 4 of the opening portion 2. Next, the nut case 45 is inserted so as to pass through under the main terminal 43 exposed from the opening portion 44 on the top surface side of the resin case 1. The nut case 45 is the resin body housing a nut in a nut receiving portion, and, for example, has a rectangular parallelepiped shape (bar shape). The nut housed in the nut receiving portion can freely move up and down inside the nut receiving portion.

The main terminal 43 has an inverted U shape, as shown in FIG. 1(c), and the nut case 45 is inserted so as to pass through inside the U-shaped hole of the main terminal 43. A top part of the main terminal 43 is exposed outside the resin case 1. At the top part of the main terminal 43 exposed outside the resin case 1, there is formed an attachment hole for attachment to an external wire.

Figure 8:
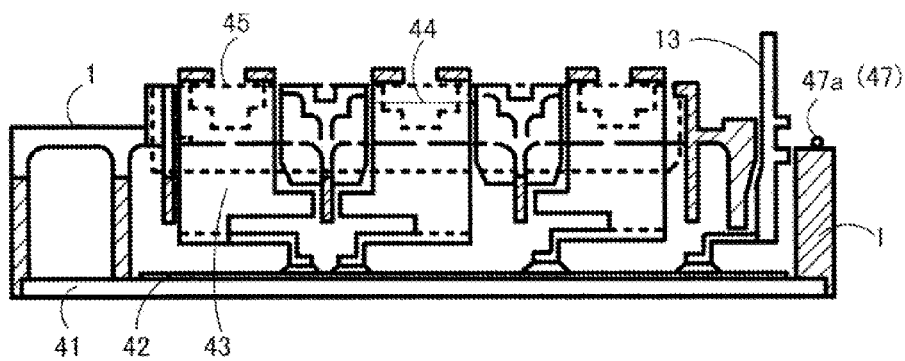
FIG. 8 are illustrative views showing steps for manufacturing the semiconductor device according to the second embodiment of the invention, following FIG. 7.
Figure 8:
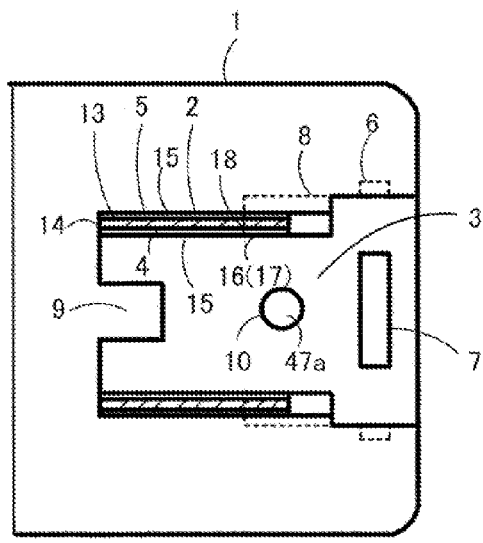

Subsequently, as shown in FIG. 8, a liquid adhesive agent 47a is dropped (or applied) in the third concave portion 10 formed in the beam portion 3 of the opening portion 2 of the resin case 1.

Figure 9:
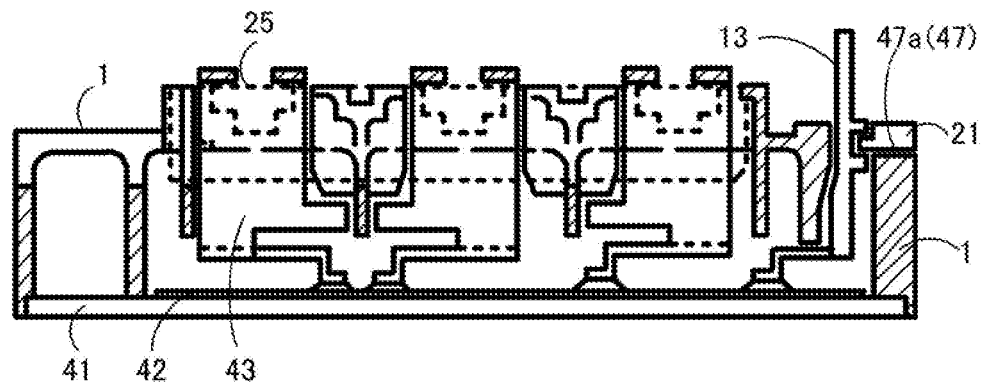
FIG. 9 are illustrative views showing steps for manufacturing the semiconductor device according to the second embodiment of the invention, following FIG. 8.
Figure 9:
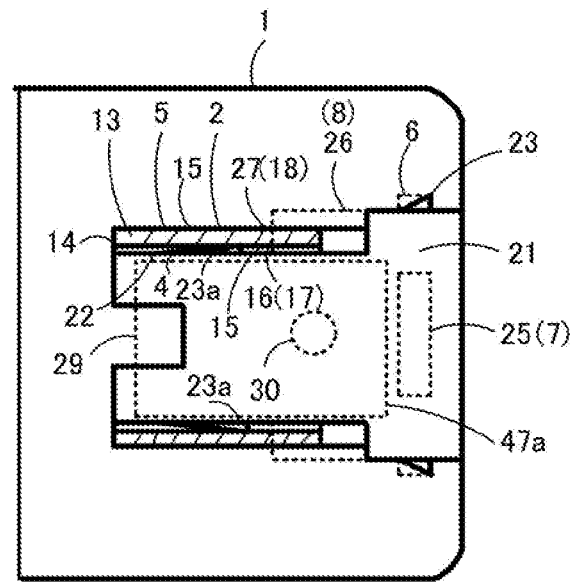

Subsequently, as shown in FIG. 9, the resin block 21 is inserted into the opening portion 2 of the resin case 1 from the side face side thereof. The insertion direction is a direction parallel to the main surface is of the resin case 1.

Since the resin block 21 includes the inclined protrusion portion 23a, a part of a force for inserting the resin block 21 is converted into the load P that presses the trunk portion 13b of the control terminal 13 to the opening portion sidewall 5 side. The trunk portion 13b is closely contacted with the opening portion sidewall 5 by the load P, and even when the control terminal 13 is inclined, the trunk portion 13b is bent about the first corner portion Q1 as a fulcrum and the second end portion 13c rotates. In this manner, the control terminal 13 can be positioned with high accuracy with respect to the resin case 1.

At this time, the front-side end portion 27 of the convex stepped portion 26 of the resin block 21 may be engaged with the valley 18 of the trunk portion 13b of the control terminal 13. The first protrusion portion 16 and the second protrusion portion 17 of the control terminal 13 are supported by the resin block 21, whereby even when an external force such as a compression load or a tensile load is applied to the control terminal 13, the control terminal 13 neither sinks into the resin case 1 nor is pulled outside the resin case 1.

Furthermore, the third protrusion portion 23 of the resin block 21 may be engaged with the first concave portion 6 of the resin case 1, and the fourth protrusion portion 25 may be engaged with the second concave portion 7 formed on a bottom portion of the opening portion 2. Engaging the plurality of protrusion portions of the resin block 21 with the opening portion 2 can prevent detachment of the resin block 21 to allow the resin block 21 to be firmly secured to the resin case 1.

Furthermore, the convex stepped portion 26 of the resin block 21 may be engaged under the first hood portion 8 of the resin case 1. The convex stepped portion 26 is formed on bottom surface sides of the first side face 22r and the second side face 22l of the resin block 21. The first hood portion 8 is formed on the main surface 1s side of the opening portion 2. Additionally, the second hood portion 9 formed on the front-side sidewall of the opening portion 2 of the resin case 1 may be engaged with the concave groove 29 formed on the front-side end portion 28 of the resin block 21. Engaging the resin block 21 with the first hood portion 8 and the second hood portion 9 can prevent lifting of the resin block 21 from the resin case 1. In addition, the top surface and the back surface of the resin block 21 inserted in the opening portion 2 are exposed from the resin case 1.

Figure 10:
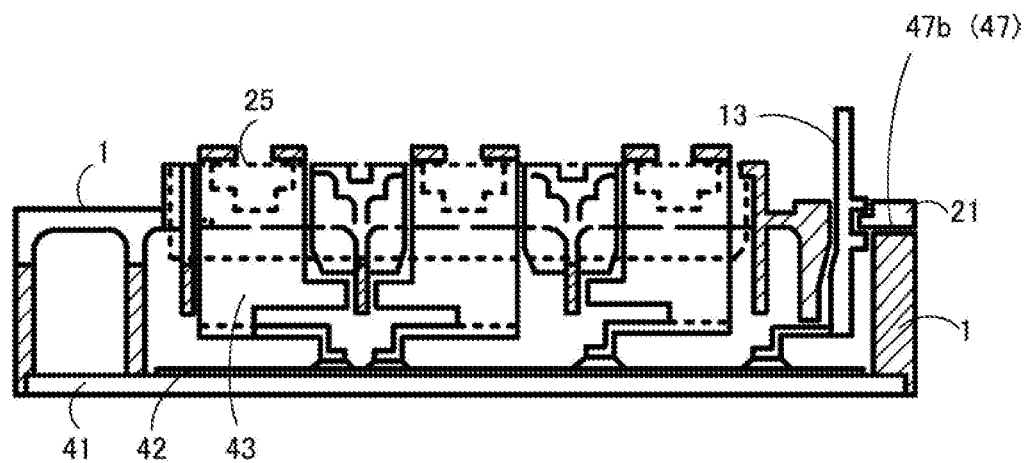
FIG. 10 are illustrative views showing steps for manufacturing the semiconductor device according to the second embodiment of the invention, following FIG. 9.
Figure 10:
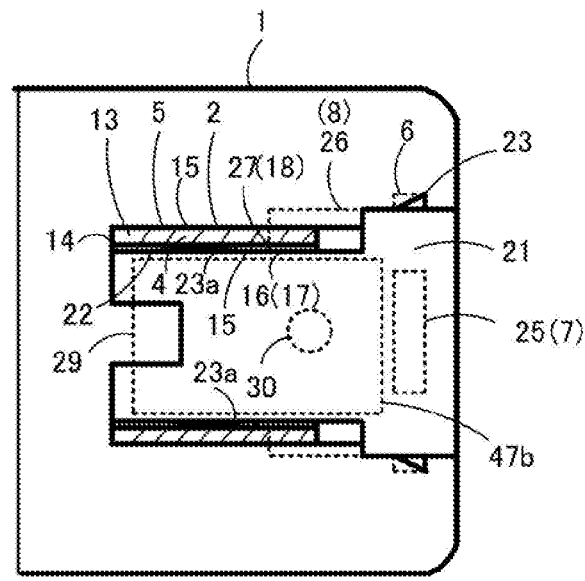
Figure 11:
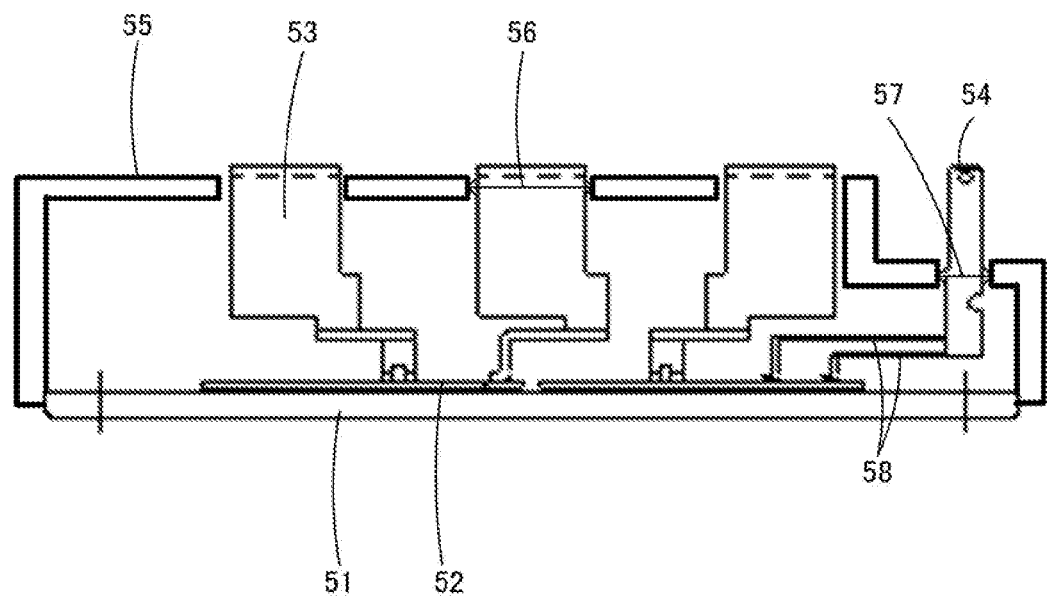
FIG. 11 is a structural view of a main part of a conventional power semiconductor module.
Figure 12:
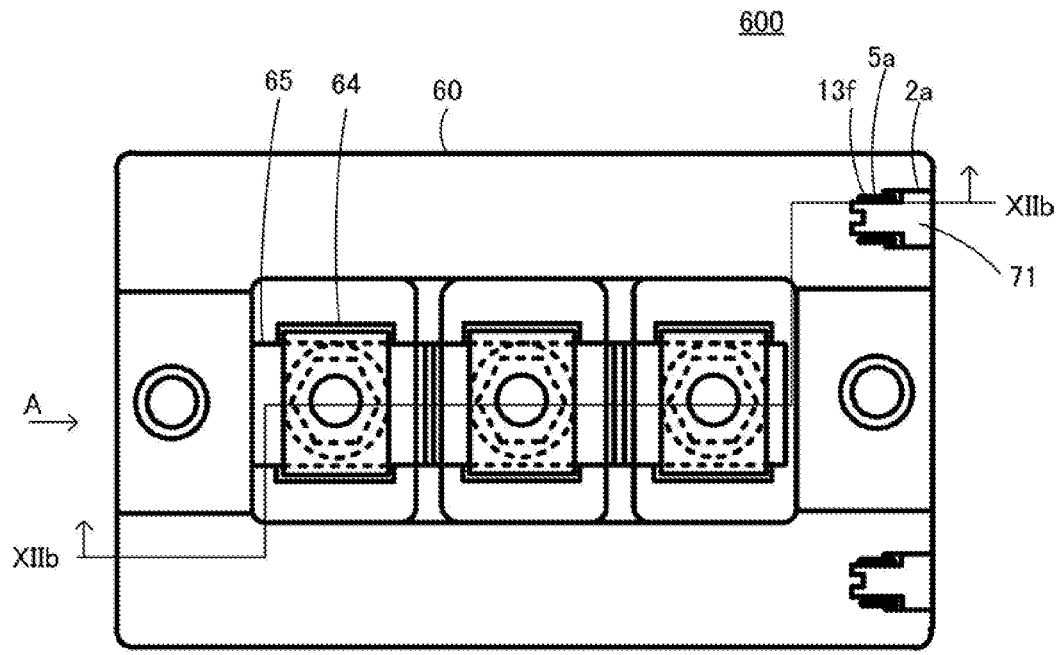
FIG. 12 are structural views of a main part of a conventional semiconductor device 600 described in Patent Document 1, in which (a) is a plan view; (b) is a side view taken along line XIIb-XIIb of FIG. 12(a); (c) is a front view of a main terminal when seen from an arrow A direction of FIG. 12 (a); and (d) is a detailed view of a section B of (b).
Figure 12:
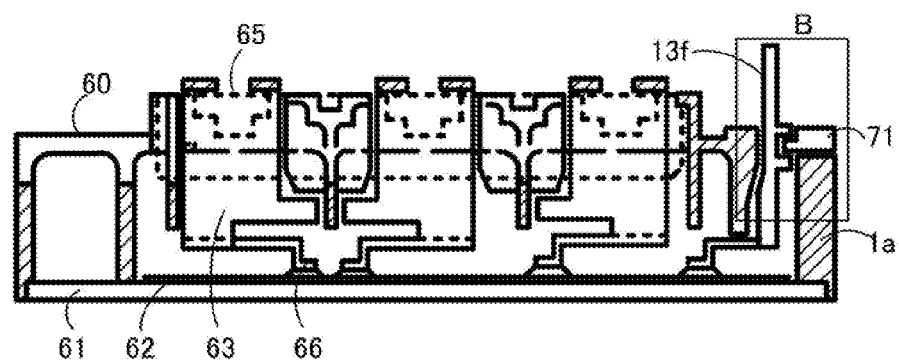
Figure 12:
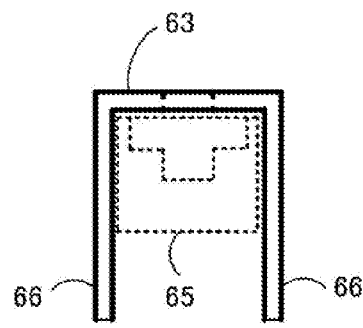
Figure 12:
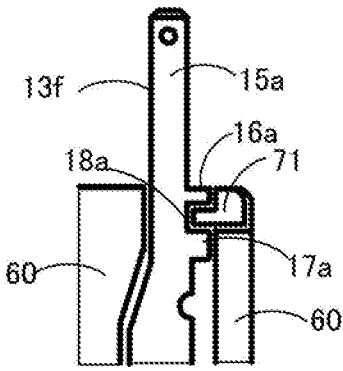
Figure 13:
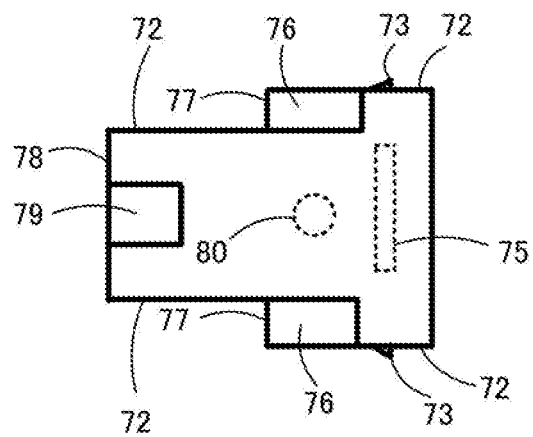
FIG. 13 are views of a conventional resin block 71, in which (a) is a plan view; (b) is a bottom view; and (c) is a side view.
Figure 13:
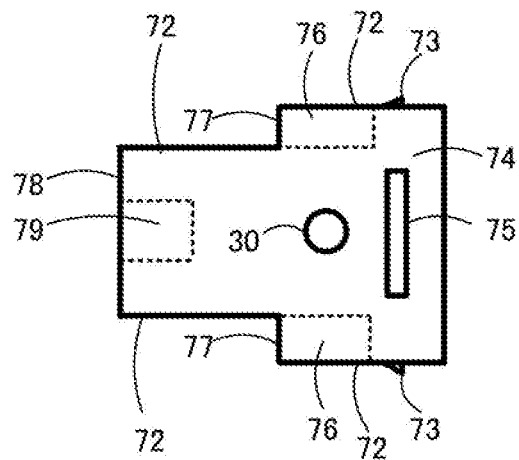
Figure 13:
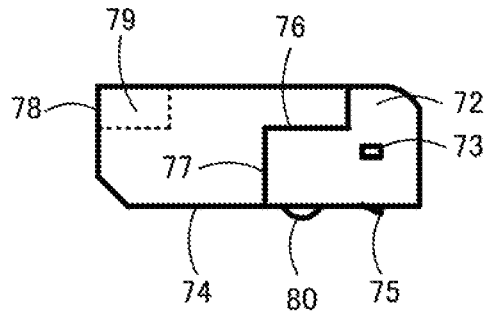

Next, as shown in FIG. 10, the adhesive agent 47a in liquid form in the third concave portion 10 is solidified into a solidified adhesive agent 47b. In order not to allow the adhesive agent in liquid form before solidification to flow out to the control terminal 13 side, a groove as the liquid reservoir portion 11 for the adhesive agent may be provided in the beam portion 3, as shown in FIG. 2(a). Additionally, the third concave portion 10 may be formed at a center of the beam portion 3 where the adhesive agent in liquid form is located and may be engaged with the fifth protrusion portion 30 formed on the bottom surface 24 of the resin block 21. In this manner, engaging the resin case 1 with the resin block 21 and at the same time bonding the resin case 1 and the resin block 21 by the adhesive agent allow the resin case 1 and the resin block 21 to be more firmly secured together. In addition, without using the adhesive agent 47a, the resin block 21 may be secured to the resin case 1 only by engagement.

Figure 17:
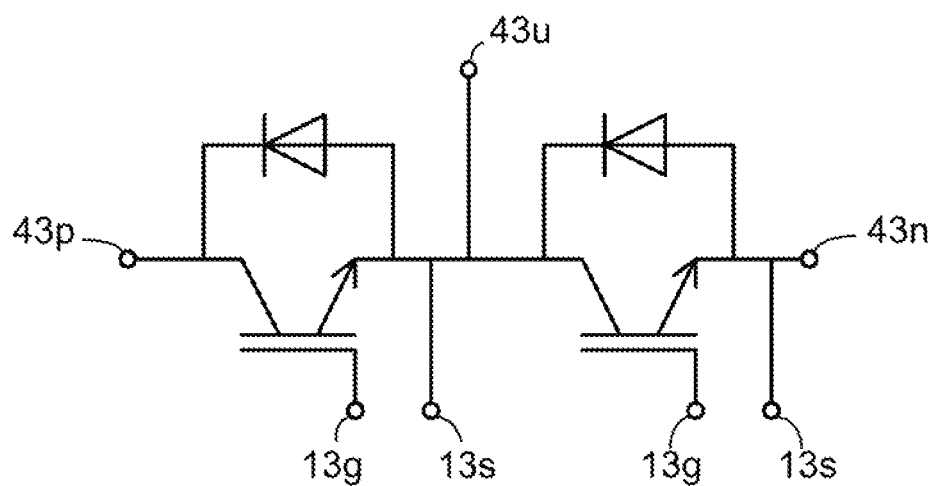
FIG. 17 is a view showing a main circuit structure of a power semiconductor module of the first embodiment.

The above-described embodiments can be applied to various power semiconductor modules such as power MOSFET modules and IGBT modules. FIG. 17 shows a circuit structure of an IGBT module having a 2 in 1 (half bridge) structure. The exemplary IGBT module includes input terminals 43p and 43n, an output terminal 43u, gate terminals 13g, and sense terminals 13s. The resin block 21 can be used to position the gate terminals 13g and the sense terminals 13s with respect to the resin case 1.

As described above, when the power semiconductor module includes the two pairs of gate terminals 13g and the sense terminals 13s, two opening portions 2 are provided in the resin case 1 and the gate terminals 13g and the sense terminals 13s are caused to pass through each through hole 4, thereby allowing positioning by the resin block 21, as in the above-described embodiments. Alternatively, an opening portion 2 may be provided for every four terminals and the resin block 21 may be inserted into each thereof to position the terminals.

The above-described embodiments can be applied to various power semiconductor modules that are to be mounted with transistor chips such as power MOSFET and IGBT and diode chips such as PN diodes and Schottky barrier diodes produced using monocrystalline silicon substrates. In addition, the embodiments can be applied to power semiconductor modules that are to be mounted with transistor chips and diode chips produced using wide bandgap semiconductors such as silicon carbide (SiC) and gallium nitride (GaN) as a substrate.

DESCRIPTION OF SYMBOLS

1 Resin case (case body)
1s Main surface
1op Opening portion
2, 2a Opening portion (groove hole)
3 Beam portion
4 Through hole
5 Opening portion sidewall
6 First concave portion
7 Second concave portion
8 First hood portion
9 Second hood portion
10 Third concave portion
11 Liquid reservoir portion
13 Control terminal
13a First end portion
13b Trunk portion
13c Second end portion
13d Connecting portion
14 Side end face
15 Flat plate surface
16 First protrusion portion
17 Second protrusion portion
18 Valley
21, 21a Resin block (positioning component)
22r First side face
22l Second side face
23 Third protrusion portion
23a Inclined protrusion portion
24 Bottom surface of resin block
25 Fourth protrusion portion
26 Convex stepped portion of side face of resin block
26a Sixth protrusion portion (tapered engaging protrusion)
27 Front-side end portion of convex stepped portion
28 Front-side end portion of resin block
29 Concave groove of resin block
30 Fifth protrusion portion
41 Heat-dissipating base
42 Circuit substrate
43 Main terminal
44 Opening portion for main terminal
45 Nut case
46 Leg of main terminal
47, 47a Adhesive agent (in liquid form)
47b Solidified adhesive agent

The invention claimed is:

1. A semiconductor device comprising:
a terminal including a first end portion, a trunk portion, and a second end portion in this order;
a circuit substrate to which the first end portion of the terminal is secured;
a case body including a main surface, an opening portion that houses the circuit substrate and is on a side opposing the main surface, and a groove hole in which there are formed a first corner portion, a sidewall, and a second corner portion that are located toward the opening portion from the main surface and a through hole located adjacent to the second corner portion; and
a positioning component that includes a first side face, a second side face opposing the first side face, a front end face positioned between the first side face and the second side face, and a back end face opposing the front end face and in which an inclined protrusion portion that becomes thicker toward the back end face from the front end face is formed on the first side face, wherein the positioning component is secured in the groove hole,
the terminal passes through the through hole toward the main surface side from the opening portion side, and the trunk portion of the terminal is pressed by the inclined protrusion portion in a direction of the sidewall to be sandwiched between the inclined protrusion portion and the sidewall, the trunk portion being supported by the first corner portion or the second corner portion, and
the second end portion of the terminal protrudes from the main surface of the case body.

2. The semiconductor device according to claim 1, wherein the second end portion is rotatable about the first corner portion or the second corner portion as a fulcrum, and the trunk portion is pressed against the sidewall, thereby positioning the terminal with respect to the case body.

3. The semiconductor device according to claim 1, wherein the inclined protrusion portion has a width of 0.1 to 0.5 times a thickness of the positioning component.

4. The semiconductor device according to claim 1, wherein the inclined protrusion portion is formed on the first side face of the positioning component so as to be positioned closer to the second corner portion between the first corner portion and the second corner portion.

5. The semiconductor device according to claim 1, wherein, in the terminal, a first protrusion portion, a second protrusion portion spaced apart from the first protrusion portion, and a concave valley between the first protrusion portion and the second protrusion portion are formed on the trunk portion,
the groove hole includes a first concave portion formed on the sidewall and a beam portion that is located on a bottom portion of the groove hole and in which a second concave portion is formed, and
the positioning component includes, on the side face sides, a convex stepped portion fitted in the concave valley of the terminal and a third protrusion portion fitted in the first concave portion and includes, on a bottom surface side, a fourth protrusion portion fitted in the second concave portion.

6. The semiconductor device according to claim 5, wherein the groove hole includes a hood portion formed on the main surface side of the sidewall and protruding toward an inside of the groove hole,
the positioning component includes a tapered engaging protrusion formed on the main surface side of the convex stepped portion, and
the tapered engaging protrusion is engaged with the hood portion.

7. The semiconductor device according to claim 5, wherein the bottom surface of the positioning component and the beam portion of the groove hole are secured by an adhesive agent.

8. The semiconductor device according to claim 7, wherein a liquid reservoir portion that prevents the adhesive agent in liquid form from flowing out to the terminal side is provided on the beam portion.

9. A method for manufacturing a semiconductor device, comprising:
preparing a circuit substrate to which a first end portion of a terminal including the first end portion, a trunk portion, and a second end portion in this order is secured and a case body including a main surface, an opening portion on a side opposing the main surface, and a groove hole that includes a first corner portion, a sidewall, and a second corner portion that are located toward the opening portion from the main surface and a through hole located adjacent to the second corner portion;

a first step of housing the circuit substrate in the opening portion so that the second end portion of the terminal passes through the through hole toward the main surface side from the opening portion side of the case body;

preparing a positioning component that includes a first side face, a second side face opposing the first side face, a front end face positioned between the first side face and the second side face, and a back end face opposing the front end face and in which an inclined protrusion portion that becomes thicker toward the back end face from the front end face is formed on the first side face; and a second step of inserting the positioning component into the groove hole and securing the positioning component in the groove hole so that, while bending by being pressed by the inclined protrusion portion in a direction of the sidewall, the trunk portion of the terminal is sandwiched between the inclined protrusion portion and the sidewall and supported by the first corner portion or the second corner portion.

10. The method for manufacturing a semiconductor device according to claim 9, wherein, in the terminal, a first protrusion portion, a second protrusion portion spaced apart from the first protrusion portion, and a concave valley between the first protrusion portion and the second protrusion portion are formed on the trunk portion, the groove hole includes a first concave portion formed in the sidewall and a beam portion that is located on a bottom portion of the groove hole and in which a second concave portion is formed, the positioning component further includes a convex stepped portion on the side face sides, a third protrusion portion on the side face sides, and a fourth protrusion portion on a bottom surface side, and at the second step, the convex stepped portion of the positioning component is fitted into the convex valley of the terminal, and the third protrusion portion and the fourth protrusion portion of the positioning component are fitted into the first concave portion and the second concave portion, respectively, of the groove hole.

11. The method for manufacturing a semiconductor device according to claim 10, further comprising a step of applying an adhesive agent to the beam portion to secure the positioning component in the groove hole.

12. The method for manufacturing a semiconductor device according to claim 11, wherein the second end portion of the terminal is rotated by the inclined protrusion portion of the positioning component until the trunk portion of the terminal contacts with the sidewall of the groove hole of the case body on a deep side in an insertion direction of the positioning component.

13. The method for manufacturing a semiconductor device according to claim 10, wherein the groove hole includes a hood portion formed on the main surface side of the sidewall and protruding toward an inside of the groove hole, the positioning component includes a tapered engaging protrusion formed on the main surface side of the convex stepped portion, and at the second step, the tapered engaging protrusion is engaged with the hood portion.

* * * * *